US012595788B2

(12) United States Patent
    Tanaka

(10) Patent No.: US 12,595,788 B2
(45) Date of Patent: Apr. 7, 2026

(54) ACTUATOR, PUMP, METHOD FOR MANUFACTURING ACTUATOR

(71) Applicant: Murata Manufacturing Co., Ltd., Kyoto (JP)

(72) Inventor: Nobuhira Tanaka, Kyoto (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 93 days.

(21) Appl. No.: 18/485,450

(22) Filed: Oct. 12, 2023

(65) Prior Publication Data

US 2024/0044323 A1 Feb. 8, 2024

Related U.S. Application Data

(63) Continuation of application No. PCT/JP2022/017808, filed on Apr. 14, 2022.

(30) Foreign Application Priority Data

Apr. 27, 2021 (JP) ................................. 2021-074741

(51) Int. Cl.
    *F04B 43/04* (2006.01)
    *H10N 30/02* (2023.01)
    (Continued)

(52) U.S. Cl.
    CPC ........... *F04B 43/046* (2013.01); *H10N 30/02* (2023.02); *H10N 30/2047* (2023.02); *H10N 30/88* (2023.02)

(58) Field of Classification Search
    CPC ........ F04B 43/046; F04B 43/02; F04B 43/04; F04B 45/04; F04B 45/047; H10N 30/02; H10N 30/2047; H10N 30/88
    See application file for complete search history.

(56) References Cited

U.S. PATENT DOCUMENTS

2009/0232680 A1* 9/2009 Kitahara ............... F04B 43/046
                                                          417/413.2
2012/0171062 A1 7/2012 Kodama et al.
                    (Continued)

FOREIGN PATENT DOCUMENTS

EP       1466097 B1 * 7/2005 ............ F04B 17/003
JP    2006-207436 A     8/2006
                    (Continued)

OTHER PUBLICATIONS

English translation of JP2014186653 (Year: 2014).*
International Search Report for PCT/JP2022/017808 dated Jul. 5, 2022.

*Primary Examiner* — Dominick L Plakkoottam
(74) *Attorney, Agent, or Firm* — McDonald Hopkins LLC

(57) ABSTRACT

An actuator includes a vibrating member, a frame, and an adhesive. The vibrating member includes a main surface and a main surface, and a piezoelectric element is mounted on the main surface. The vibrating member has a plate shape and includes an outer edge portion having a greater shape than the piezoelectric element in plan view and not abutting the piezoelectric element). The frame has an outer edge shape that is smaller than the vibrating member. The frame and the main surface in the outer edge portion of the vibrating member are adhered to each other with the adhesive. In plan view, the outer edge shape of the frame is smaller than an outer shape of the outer edge portion of the vibrating member. The frame includes a projection portion that projects outward from part of an outer edge.

20 Claims, 6 Drawing Sheets

(51) Int. Cl.
     H10N 30/20      (2023.01)
     H10N 30/88      (2023.01)

(56)        References Cited

U.S. PATENT DOCUMENTS

| | | | |
|---|---|---|---|
| 2013/0058818 A1* | 3/2013 | Hirata | F04B 45/047 |
| | | | 417/479 |
| 2013/0266461 A1* | 10/2013 | Hirata | F04B 43/0054 |
| | | | 417/413.2 |
| 2017/0058882 A1* | 3/2017 | Hirata | F04B 43/046 |
| 2017/0066241 A1* | 3/2017 | Naganuma | B41J 2/1628 |
| 2018/0066768 A1* | 3/2018 | Han | H02N 2/001 |
| 2018/0139542 A1* | 5/2018 | Zou | H04R 31/00 |

FOREIGN PATENT DOCUMENTS

| | | | |
|---|---|---|---|
| JP | 2008-180161 A | | 8/2008 |
| JP | 2013-100746 A | | 5/2013 |
| JP | 2014186653 A | * | 10/2014 |
| WO | 2011/145544 A1 | | 11/2011 |

\* cited by examiner

FIG. 3C
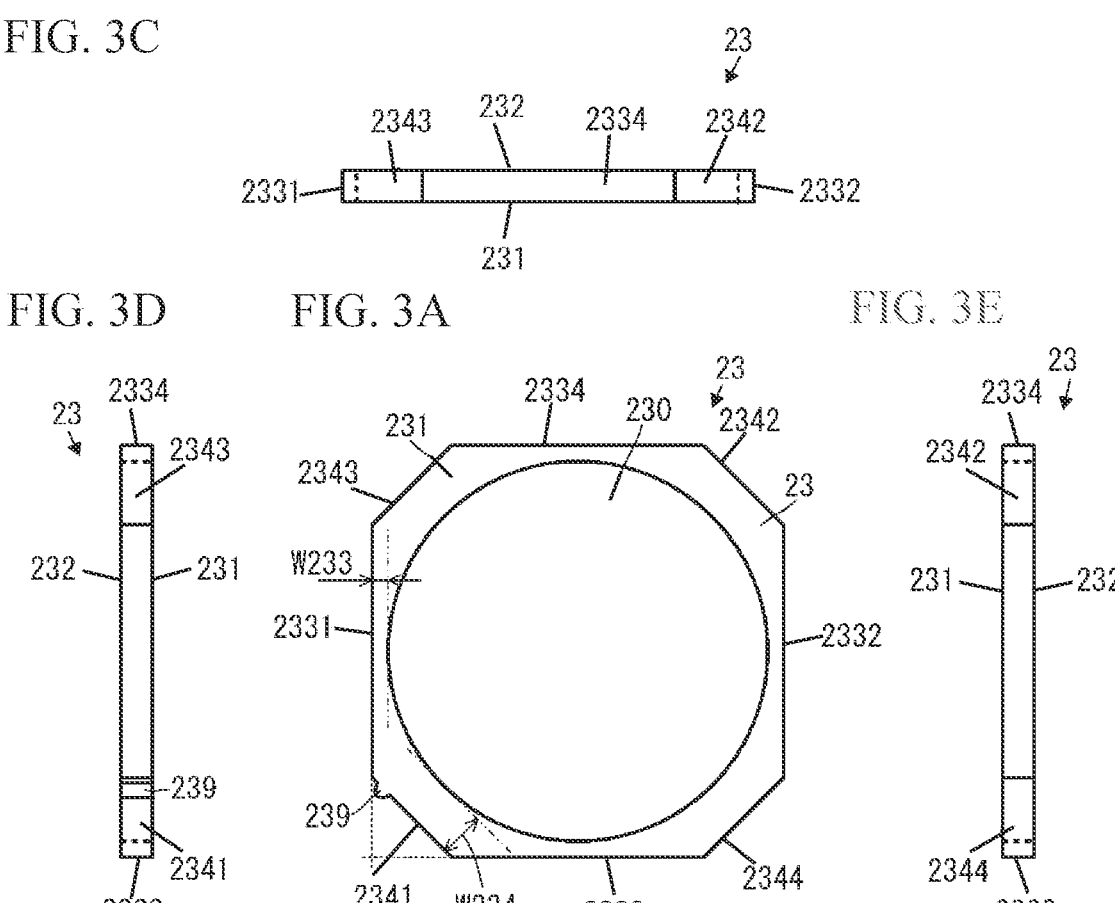
FIG. 3D          FIG. 3A          FIG. 3E
FIG. 3B
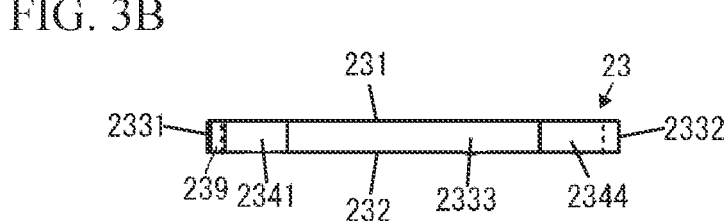

FIG. 5

EXTENSION
DIRECTION

FIG. 6A
FIG. 6B
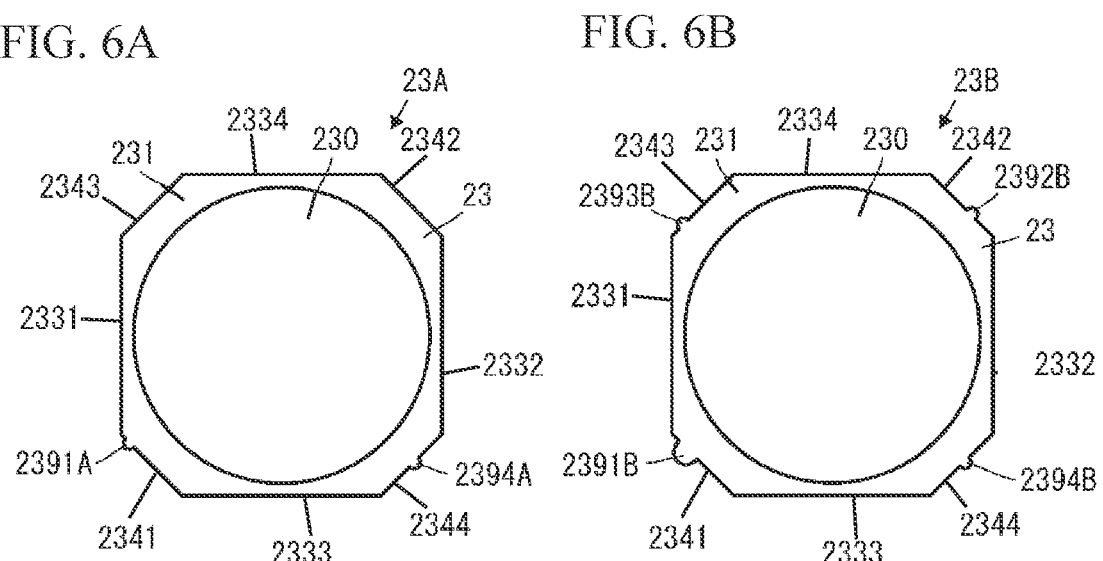
FIG. 6C
FIG. 6D
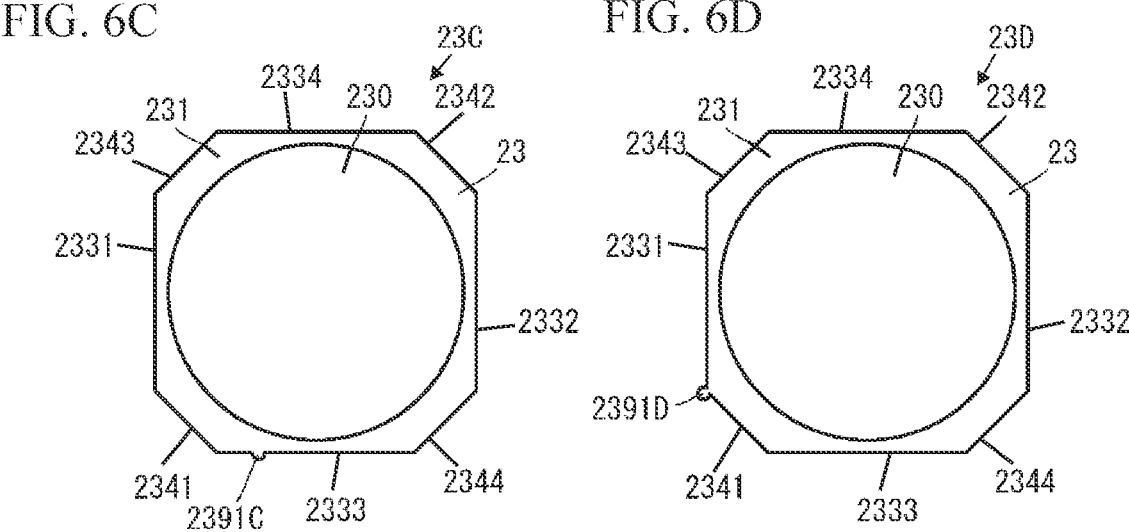

ACTUATOR, PUMP, METHOD FOR MANUFACTURING ACTUATOR

CROSS REFERENCE TO RELATED APPLICATION

This is a continuation of International Application No. PCT/JP2022/017808 filed on Apr. 14, 2022 which claims priority from Japanese Patent Application No. 2021-074741 filed on Apr. 27, 2021. The contents of these applications are incorporated herein by reference in their entireties.

BACKGROUND OF THE DISCLOSURE

Field of the Disclosure

The present disclosure relates to an actuator of which a housing is assembled with an adhesive.

Description of the Related Art

A fluid pump is described in Patent Document 1. The fluid pump described in Patent Document 1 includes a vibrating plate, a vibrating plate support frame, a connecting portion, a piezoelectric element, a spacer, and a lid portion. The vibrating plate is a circular plate. The vibrating plate support frame has a shape that surrounds an outer circumference of the vibrating plate. The vibrating plate is held by using the connecting portion such that the vibrating plate can vibrate relative to the vibrating plate support frame. The piezoelectric element is mounted on the vibrating plate.

The lid portion is disposed so as to face a plate member including the vibrating plate, the connecting portion, and the vibrating plate support frame. The spacer is disposed between the plate member and the lid portion. The spacer has a frame shape having a hollow portion and is connected to the vibrating plate support frame and the lid portion.

Outer shapes of the lid portion, the spacer, and the vibrating plate support frame are the same, and these are adhered to each other by using, for example, an adhesive.

Patent Document 1: International Publication No. 2011/145544

BRIEF SUMMARY OF THE DISCLOSURE

However, with the related-art configuration as in Patent Document 1, members to be adhered together are not necessarily sufficiently adhered together due to, for example, unnecessary extension of the adhesive to, for example, the outside. Consequently, the reliability may reduce. In particular, the reliability of the device that generates vibration as described in Patent Document 1 is likely to reduce due to the reduction of adhesion properties.

Accordingly, a possible benefit of the present disclosure is to improve the adhesion properties of the included members to realize a highly reliable device.

An actuator according to the present disclosure includes a vibrating member, a frame, and an adhesive. The vibrating member includes a first main surface and a second main surface, and a piezoelectric element is mounted on at least one of the first main surface and the second main surface. The vibrating member has a plate shape and includes an outer edge portion having a greater shape than the piezoelectric element in plan view and not abutting the piezoelectric element. The frame has an outer edge shape that is smaller than the vibrating member. The frame and the first main surface or the second main surface in the outer edge portion of the vibrating member are adhered to each other with the adhesive. In plan view, the outer edge shape of the frame is smaller than an outer edge shape of the vibrating member. The frame includes a projection portion that projects outward from part of an outer edge.

With this configuration, the adhesive is adhered also to a portion of the projection portion, and accordingly, an adhesion region increases compared to that in the case where the projection portion does not exist.

According to the present disclosure, the adhesion properties of the included members are improved and a high reliability is realized.

BRIEF DESCRIPTION OF THE SEVERAL VIEWS OF THE DRAWINGS

FIG. 3A is a plan view of a frame, and FIGS. 3B, 3C, 3D, and 3E are side views of the frame.

FIG. 5 is a conceptual diagram of cutting of frames.

FIGS. 6A, 6B, 6C, and 6D are plan views illustrating derived examples of the frame.

DETAILED DESCRIPTION OF THE DISCLOSURE

Figure 1:
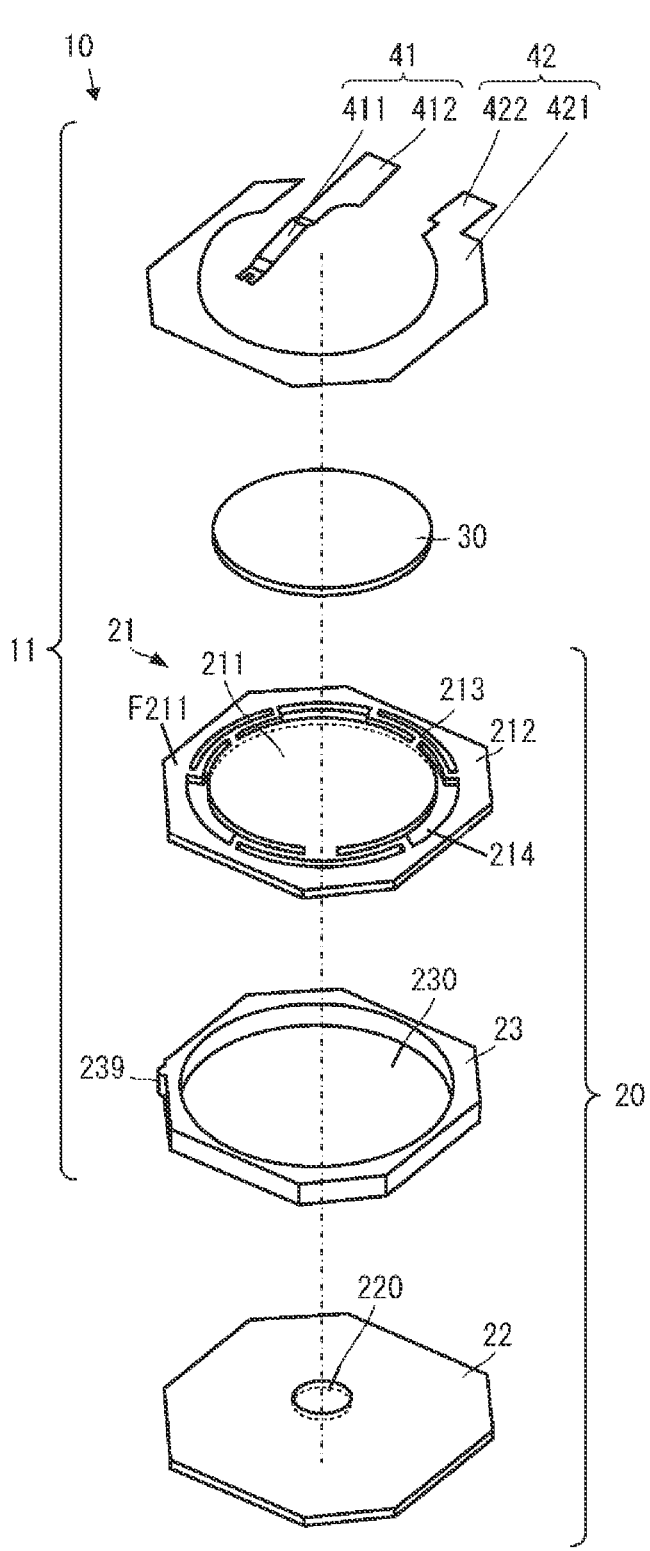
FIG. 1 is an exploded perspective view of a pump according to a first embodiment of the present disclosure.
Figure 2A:
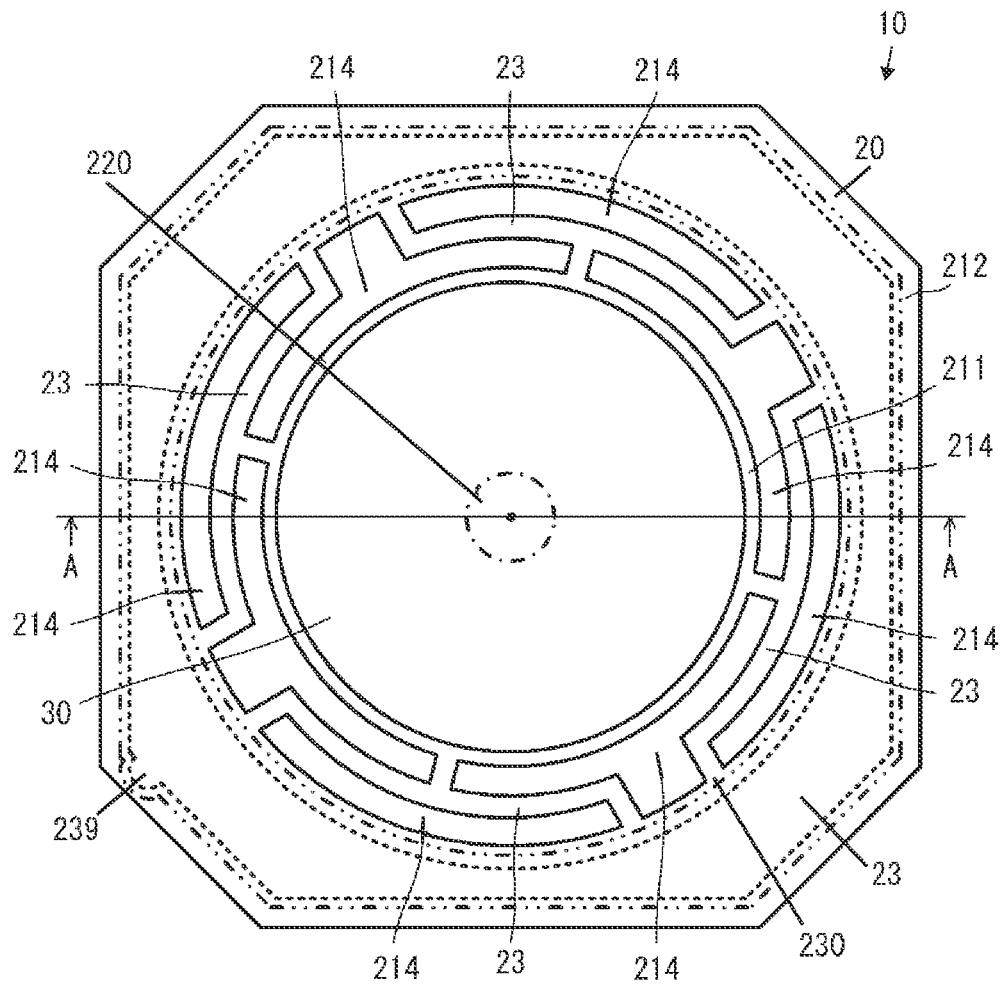
FIG. 2A is a plan view of the pump according to the first embodiment of the present disclosure.
Figure 2B:
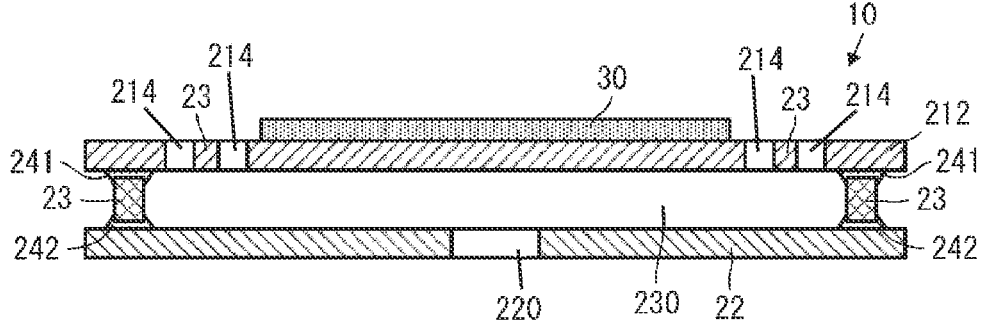
FIG. 2B is a sectional view of the pump taken along line A-A of FIG. 2A.

An actuator and a pump according to an embodiment of the present disclosure are described with reference to the drawings. FIG. 1 is an exploded perspective view of the pump according to a first embodiment of the present disclosure. FIG. 2A is a plan view of the pump according to the first embodiment of the present disclosure. FIG. 2B is a sectional view of the pump taken along line A-A of FIG. 2A. In FIGS. 2A and 2B, illustration of an electrode pattern is omitted. In each of the drawings indicated in embodiments including the present embodiment, shapes of elements may be partly or entirely exaggerated for ease of understanding of the configuration of a fluid control apparatus.

As illustrated in FIGS. 1, 2A, and 2B, a pump 10 includes an actuator 11 and a housing 20. Some of the components of the actuator 11 and the housing 20 overlap.

The actuator 11 includes a vibrating member 21, a frame 23, a piezoelectric element 30, and electrode patterns 41 and 42. The housing 20 includes the vibrating member 21, a lid member 22, and the frame 23.

The vibrating member 21 is a flat plate having a main surface F211 and a main surface F212 (not shown). The vibrating member 21 is formed by, for example, punching a metal.

The vibrating member 21 includes a main flat plate 211, an outer edge portion 212, and connecting portions 213.

The main flat plate 211 has a circular shape in plan view. The outer edge portion 212 has an annular shape in plan view. An inner end of the outer edge portion 212 has a circular shape, and an outer end of the outer edge portion 212 has an octagonal shape. In plan view, the inner end of the outer edge portion 212 is positioned outside an outer edge of the main flat plate 211 and separate from the outer edge of the main flat plate 211.

The connecting portions 213 are disposed between the outer edge of the main flat plate 211 and the inner end of the outer edge portion 212. A plurality of the connecting portions 213 are arranged so as to be spaced from each other along the outer edge of the main flat plate 211. The connecting portions 213 have a beam shape and connect the outer edge of the main flat plate 211 and the inner end of the outer edge portion 212 to each other. With this configuration, the main flat plate 211 is held so as to be able to bend and vibrate relative to the outer edge portion 212 with the connecting portions 213 interposed therebetween. In a region between the main flat plate 211 and the outer edge portion 212, regions where no connecting portion 213 exits are openings 214 formed in the vibrating member 21.

The piezoelectric element 30 is a circular plate and formed of a piezoelectric body. The piezoelectric element 30 is disposed so as to abut the main surface F211 of the main flat plate 211.

The lid member 22 has an octagonal shape in plan view. An outer shape of the lid member 22 in plan view is substantially the same as an outer shape of the outer edge portion 212 of the vibrating member 21. The lid member 22 has an opening 220. The opening 220 is formed substantially in the center of the lid member 22 in plan view. The opening 220 is smaller than the piezoelectric element 30 in plan view. The lid member 22 is formed by, for example, punching a metal.

The frame 23 has an annular shape in plan view and has an inner space 230 having a tubular shape. An inner circumferential end of the frame 23 has a circular shape, and an outer circumferential end of the frame 23 has an octagonal shape. The frame 23 is formed by, for example, punching a metal.

In plan view, the shape of the inner circumferential end of the frame 23 is substantially similar to the shape of the inner end of the outer edge portion 212 of the vibrating member 21. A circle that defines the inner circumferential end of the frame 23 is greater than a circle that defines an inner circumferential end of the outer edge portion 212.

In plan view, the shape of the outer circumferential end (outer shape) of the frame 23 is substantially similar to the shape of an outer circumferential end (outer shape) of the outer edge portion 212 of the vibrating member 21. The outer shape of the frame 23 is smaller than the outer shape of the outer edge portion 212 of the vibrating member 21. For example, the outer shape of the lid member 22 is greater than or equal to about 0.9 times and smaller than about 1.0 times the outer shape of the outer edge portion 212 of the vibrating member 21. These relationships of scales are exemplary, and the relationships of scales are not limited to the above description.

In plan view, the frame 23 is superposed on the outer edge portion 212 of the vibrating member 21. One end surface of the frame 23 in the height direction (a direction orthogonal to an inner end surface and an outer end surface) is adhered to the main surface F212 in the outer edge portion 212 with an adhesive 241.

Furthermore, in plan view, the frame 23 is superposed on the lid member 22. The other end surface of the frame 23 in the height direction (the direction orthogonal to the inner end surface and the outer end surface) is adhered to the lid member 22 with the adhesive 242.

With this configuration, the housing 20 has an inner space 230 surrounded by the vibrating member 21, the lid member 22, and the frame 23. This inner space 230 functions as a pump room of the pump 10. The inner space 230 communicates with the outside of the housing 20 through the openings 214 and the opening 220.

The electrode pattern 41 includes an inner connecting portion 411 and an outer terminal 412. The inner connecting portion 411 of the electrode pattern 41 is superposed on the piezoelectric element 30 in plan view, and a distal end portion of the inner connecting portion 411 is in contact with a surface of the piezoelectric element 30 on the opposite side from a surface of the piezoelectric element 30 abutting the vibrating member 21. The outer terminal 412 projects further outward than the outer edge portion 212 of the vibrating member 21 in plan view.

The electrode pattern 42 includes an inner connecting portion 421 and an outer terminal 422. The inner connecting portion 421 of the electrode pattern 42 is superposed on the outer edge portion 212 in plan view and in contact with the main surface F211 of the outer edge portion 212. The outer terminal 422 projects further outward than the outer edge portion 212 of the vibrating member 21 in plan view.

With the configuration as described above, the actuator 11 and the pump 10 operate as follows.

A drive voltage is applied to the piezoelectric element 30 through the electrode pattern 41 and the electrode pattern 42. Thus, the piezoelectric element 30 is strained, and the main flat plate 211 vibrates.

Here, the outer edge portion 212 is secured by the frame 23. The main flat plate 211 is held by the connecting portions 213 so as to be able to vibrate. Accordingly, in the vibrating member 21, the main flat plate 211 vibrates with the outer edge portion 212 virtually secured by the frame 23. Thus, the function as the actuator 11 is realized.

When the main flat plate 211 vibrates, a fluid can be sucked from the outside into the inner space 230 through the openings 214 and discharged from the inner space 230 to the outside through the opening 220. The flow of the fluid can be reversed. That is, the fluid can be sucked from the outside into the inner space 230 through the opening 220 and discharged from the inner space 230 to the outside through the openings 214. Thus, the function as the pump 10 is realized.

In the actuator 11 and the pump 10 as described above, the frame 23 specifically has the following configuration. FIG. 3A is a plan view of the frame, and FIGS. 3B, 3C, 3D, and 3E are side views of the frame.

As illustrated in FIGS. 3A to 3E, the frame 23 has the inner space 230 and includes a projection portion 239. In plan view, the outer shape of the frame 23 is an octagon except for the projection portion 239. The frame 23 includes a main surface 231, a main surface 232, a side surface 2331, a side surface 2332, a side surface 2333, a side surface 2334, a side surface 2341, a side surface 2342, a side surface 2343, and a side surface 2344.

The main surface 231 and the main surface 232 are both end surfaces of the frame 23 in the thickness direction and opposite from each other. The outer shape of each of the main surface 231 and the main surface 232 (except for the projection portion 239) is octagonal.

The side surface 2331, the side surface 2332, the side surface 2333, the side surface 2334, the side surface 2341, the side surface 2342, the side surface 2343, and the side surface 2344 are orthogonal to the main surface 231 and the main surface 232 and connected to outer edges of the main surface 231 and the main surface 232.

The side surface 2331 and the side surface 2332 are opposite from each other, and the side surface 2333 and the side surface 2334 are opposite from each other. The side surfaces 2331, 2332 and the side surfaces 2333, 2334 are perpendicular to each other.

The side surface 2341 and the side surface 2342 are opposite from each other, and the side surface 2343 and the side surface 2344 are opposite from each other. The relationships between the side surfaces 2341, 2342 and the side surfaces 2343, 2344 are such that the side surfaces 2341, 2342 and the side surfaces 2343, 2344 are perpendicular to each other.

The side surface 2341 connects the side surface 2331 and the side surface 2333 to each other. The side surface 2341 is disposed such that the side surface 2341 is angled at 135° relative to the side surface 2331 and the side surface 2333 on a side near the center of the frame 23.

The side surface 2342 connects the side surface 2332 and the side surface 2334 to each other. The side surface 2342 is disposed such that the side surface 2342 is angled at 135° relative to the side surface 2332 and the side surface 2334 on the side near the center of the frame 23.

The side surface 2343 connects the side surface 2331 and the side surface 2334 to each other. The side surface 2343 is disposed such that the side surface 2343 is angled at 135° relative to the side surface 2331 and the side surface 2334 on the side near the center of the frame 23.

The side surface 2344 connects the side surface 2332 and the side surface 2333 to each other. The side surface 2344 is disposed such that the side surface 2344 is angled at 135° relative to the side surface 2332 and the side surface 2333 on the side near the center of the frame 23.

The lengths of the side surface 2331, the side surface 2332, the side surface 2333, and the side surface 2334 are the same (the lengths in plan view are the same). The lengths of the side surface 2341, the side surface 2342, the side surface 2343, and the side surface 2344 are the same (the lengths in plan view are the same). Each of the side surface 2331, the side surface 2332, the side surface 2333, and the side surface 2334 is longer than each of the side surface 2341, the side surface 2342, the side surface 2343, and the side surface 2344, respectively. Thus, as illustrated in FIG. 3A, an octagon having four long sides and four short sides that are alternately repeated along the outer circumference is realized.

As illustrated in FIG. 3A, the frame 23 has the inner space 230 having a circular shape in plan view. The inner space 230 is a through hole extending through the frame 23 from the main surface 231 to the main surface 232.

The center of the frame 23 and the center of the inner space 230 match each other. Here, the term "match" also means the case where both the centers are slightly misaligned with each other due to, for example, errors in the manufacture.

Since the frame 23 has the above-described octagonal shape and the inner space 230 has a circular shape (tubular shape), a thickness W233 from the side surface 2331, the side surface 2332, the side surface 2333, and the side surface 2334 to the side near the center is less than a thickness W234 from the side surface 2341, the side surface 2342, the side surface 2343, and the side surface 2344 to the side near the center. In other words, the thickness W233 from the side surfaces of the long sides to the side near the center is less than the thickness W234 from the side surfaces of the short sides to the side near the center. As indicated by the thicknesses W233 and W234 of FIG. 3A, the thicknesses from the side surfaces to the side near the center are defined by the minimum distance between the side surfaces and the inner space 230.

The projection portion 239 projects outward from the side surface 2341 that is an outer edge of the frame 23. For example, the projection portion 239 has a semicircular columnar shape and projects from part of the side surface 2341. Here, the term "part" means part in the circumferential direction of the side surface 2341. The projection portion 239 is formed entirely in the thickness direction of the frame 23.

For example, the amount of the projection of the projection portion 239 is about 5 μm when the distance between the center and each side surface in the frame 23 is about 30 μm. This dimension is exemplary, and the projection amount of the projection portion 239 is not limited to this.

When the projection portion 239 as described above is provided, the area of adhesion between the frame 23 and the outer edge portion 212 of the vibrating member 21 and the area of adhesion between the frame 23 and the lid member 22 increase compared to a comparative configuration (related-art configuration) without the projection portion 239.

Figure 4A:
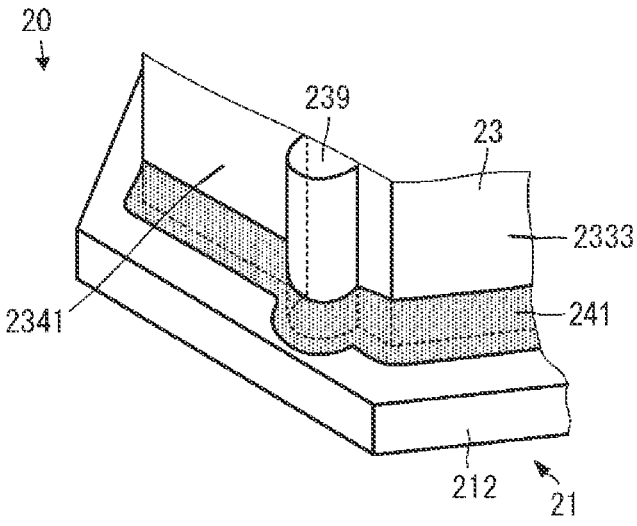
FIGS. 4A and 4B are extended perspective views of parts of examples of an adhesion state between the frame and a vibrating member.
Figure 4B:
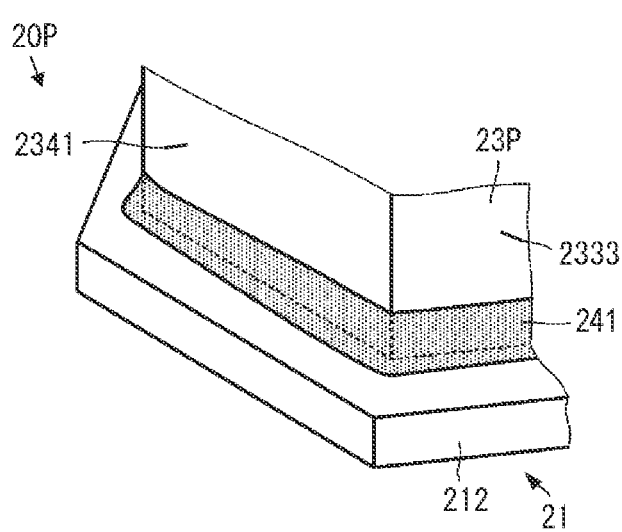

FIGS. 4A and 4B are extended perspective views of parts of examples of an adhesion state between the frame and the vibrating member. FIG. 4A illustrates the configuration according to the present embodiment, and FIG. 4B illustrates the comparative configuration.

As can been seen from a comparison between the FIGS. 4A and 4B, when the projection portion 239 is provided, the area of contact between the frame 23 and the outer edge portion 212 of the vibrating member 21 increases, and the length of an external line of contact between the frame 23 and the outer edge portion 212 of the vibrating member 21 also increases. Accordingly, the area where the frame 23 and the outer edge portion 212 of the vibrating member 21 are adhered to each other with the adhesive 241 increases not only in an end surface in the thickness direction of the frame 23 but also in the side surface. In other words, the size of a fillet formed by the adhesive 241 in the frame 23 and the outer edge portion 212 of the vibrating member 21 also increases. Accordingly, an adhesion strength between the frame 23 and the outer edge portion 212 of the vibrating member 21 improves. Thus, the actuator 11 can realize high reliability.

Although it is not illustrated, the adhesion between the frame 23 and the lid member 22 is similar to the adhesion between the frame 23 and the outer edge portion 212 of the vibrating member 21. Accordingly, the adhesion strength between the frame 23 and the lid member 22 improves. Thus, the pump 10 can realize high reliability.

Furthermore, the outer shape of the outer edge portion 212 of the vibrating member 21 is greater than the outer shape of the frame 23. Thus, even when the adhesive 241 extends outward past the frame 23, the outward extension of the adhesive 241 past the outer edge portion 212 of the vibrating member 21 is suppressed.

Likewise, the outer shape of the lid member 22 is greater than the outer shape of the frame 23. Thus, even when the adhesive 242 extends outward past the frame 23, the outward extension of the adhesive 242 past the lid member 22 is suppressed.

Thus, when another member is adhered or joined to the housing 20, the adhesive 241 or 242 does not adversely affect this adhering or joining.

Furthermore, as described above, the projection portion 239 preferably does not project from an outline of the outer edge portion 212 of the vibrating member 21 or the lid member 22. In other words, the projection amount of the projection portion 239 is preferably smaller than the absolute value of the difference between the distance between the center and the side surface 2341 in the frame 23 and the distance between the center to an outer edge of a portion of the outer edge portion 212 to which the side surface 2341 is adhered in the vibrating member 21.

Thus, in plan view of the actuator 11 and the pump 10, the lateral projection of the projection portion 239 can be suppressed. Accordingly, increases in the sizes of the planar shapes of the actuator 11 and the pump 10 are suppressed. Furthermore, the extension of the adhesives 241 and 242 past the side surfaces of the actuator 11 and the pump 10 is suppressed.

Furthermore, the projection portion 239 is disposed in a space surrounded by the side surface 2341 and phantom lines (the dotted lines of FIG. 3A) that extend from the side surface 2331 and the side surface 2333 (corresponding to a "first connection side surface" and a "second connection side surface" of the present disclosure) connected to the side surface 2341 where the projection portion 239 is formed toward the side surface 2341. Thus, the projection portion 239 is disposed within a quadrangle formed by connecting the side surface 2331, the side surface 2332, the side surface 2333, and the side surface 2334 of the frame 23 in plan view. Thus, an increase in the size of a distance Ls (see FIG. 5) between adjacent frames 23 due to the projection portion 239 relative to a mother board M23 (see FIG. 5) can be suppressed. That is, a reduction of the number of frames 23 obtained from the mother board M23 can be suppressed.

It is sufficient that the projection portion 239 be at least formed, in the frame 23, at or near an end portion on the outer edge portion 212 side of the vibrating member 21. Thus, the adhesion strength between the frame 23 and the outer edge portion 212 of the vibrating member 21 improves. Accordingly, the outer edge portion 212 can be secured more firmly, and unnecessary leakage of vibration to the outer edge portion 212 is suppressed. The outer edge portion 212 is susceptible to the vibration of the main flat plate 211. However, when the adhesion strength is improved, the removal of the frame 23 and outer edge portion 212 from each other can be more reliably suppressed.

Furthermore, in the above-described configuration, the projection portion 239 is formed on the side surface 2341 that is a short side. In other words, the projection portion 239 is formed on a side surface that is different from a longest side surface of the frame 23. Thus, the projection portion 239 is formed on a side wall having a great thickness in the frame 23.

When the projection portion 239 is formed at such a position, the generation of unnecessary vibration due to the formation of the projection portion 239 can be suppressed. That is, the pump 10 has a uniform shape throughout the circumference in plan view. When the frame 23 has the same shape, the vibration is equalized throughout the circumference, and the likelihood of the generation of unnecessary vibration reduces. Here, when the projection portion 239 is formed, the thickness of the side wall increases only in a portion where the projection portion 239 is provided. Thus, when the projection portion 239 is provided, the likelihood of the generation of unnecessary vibration increases. However, when the projection portion 239 is formed in a portion having a great thickness, the variation in the thickness of the side walls reduces compared to the case where the projection portion 239 is formed in a portion having a less thickness. Accordingly, when the projection portion 239 is formed in a portion having a great thickness, the generation of unnecessary vibration can be suppressed compared to the case where the projection portion 239 is formed in a portion having a less thickness.

Furthermore, in the above-described configuration, in plan view, the position of the projection portion 239 and the positions where the electrode patterns 41 and 42 extend outward are different from each other and spaced from each other. Specifically, the positions where the electrode patterns 41 and 42 extend outward are located on a substantially opposite side from the position of the projection portion 239 with the inner space 230 of the frame 23 interposed therebetween. Thus, the adverse effects exerted on the electrode patterns 41 and 42 by unnecessary vibration can be suppressed. For example, the removal of the electrode patterns 41 and 42 due to the unnecessary vibration, in particular, the removal of the electrode pattern 41 is suppressed.

Figure 5:
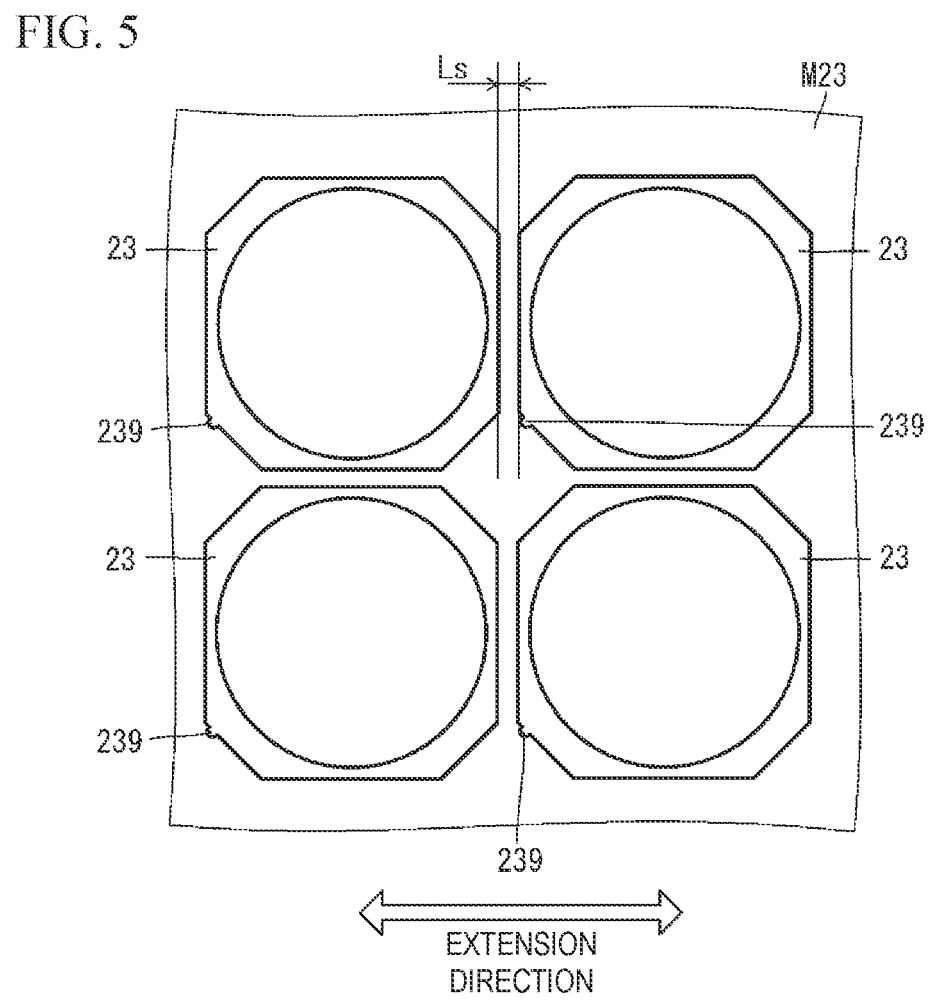

The actuator 11 and the pump 10 as described above are manufactured as follows. FIG. 5 is a conceptual diagram of cutting of the frame.

First, the vibrating member 21, the lid member 22, and the frame 23 are cut out of respective mother boards. Each mother board is a metal plate having undergone an extension process. For example, as illustrated in FIG. 5, regarding the frame 23, a plurality of frames 23 are cut out so that the positions of projection portions 239 relative to the respective frames 23 match each other in an extension direction of the mother board M23.

Although it is not illustrated, vibrating members 21 and lid members 22 are also cut out so that the orientations match in the extension direction of the mother board M23.

The vibrating member 21, the lid member 22, and the frame 23 are adhered to each other with the adhesives 241 and 242. In so doing, in all actuators 11 and all pumps 10, the vibrating member 21, the lid member 22, and the frame 23 are adhered so that the orientations of these match each other.

The piezoelectric element 30 is mounted on the vibrating member 21, and the electrode patterns 41 and 42 are mounted.

When such a method for manufacturing is used, a plurality of the highly reliable pumps 10, in which the shapes of spaces (inner spaces 230) surrounded by the vibrating members 21, the lid members 22, and the frames 23 match each other and which exhibit stable pump characteristics, can be manufactured in a stable manner. The stable pump characteristics mean that, for example, the durability is high, a desired flow rate can be obtained, and so forth.

Likewise, the highly reliable actuators 11 which exhibit stable vibration characteristics can be manufactured.

[Derived Examples of Frame]

FIGS. 6A, 6B, 6C, and 6D are plan views illustrating derived examples of the frame.

As illustrated in FIG. 6A, a frame 23A includes a projection portion 2391A and a projection portion 2394A. The projection portion 2391A is the same as the projection portion 239. The projection portion 2394A has a shape projecting from the side surface 2344. Thus, a plurality of the projection portions may be provided. For example, the projection portion 2391A corresponds to a "first projection portion" of the present disclosure, and the projection portion 2394A corresponds to a "second projection portion" of the present disclosure. As illustrated in FIG. 6B, a frame 23B includes a projection portion 2391B, a projection portion 2392B, a projection portion 2393B, and a projection portion 2394B. The projection portion 2391B is the same as the projection portion 239. The projection portion 2392B has a shape projecting from the side surface 2342. The projection portion 2393B has a shape projecting from the side surface 2343. The projection portion 2394B has a shape projecting from the side surface 2344. The projection portion 2391B corresponds to the "first projection portion" of the present disclosure, and the projection portions 2392B, 2393B, and 2394B each correspond to the "second projection portion" of the present disclosure.

The projection portion 2392B, the projection portion 2393B, and the projection portion 2394B have the same shape (second shape). The projection portion 2391B has a different shape (first shape) from the shape of the projection portion 2392B, the projection portion 2393B, and the projection portion 2394B. In other words, the frame 23B includes a plurality of the projection portions, and only the projection portion 2391B has the different shape. In the case where a plurality of the projection portions exist as described above, the disposition of the projection portion having a different shape from the shape of the other projection portions at a specific position of the side surface of the frame allows easy determination of the orientation of the frame 23B even when the plurality of the projection portions are provided.

As illustrated in FIG. 6C, a frame 23C includes a projection portion 2391C. The projection portion 2391C has a shape projecting from the side surface 2333. Thus, the projection portion may have a shape projecting from a long side of the octagon of the frame 23C. However, the projection portion preferably has a shape projecting from a short side to obtain some of the above-described operational effects.

As illustrated in FIG. 6D, a frame 23D includes a projection portion 2391D. The projection portion 2391D is formed at a corner portion where the side surface 2331 and the side surface 2341 are connected to each other. Thus, the projection portion may have a shape projecting from a corner portion of the frame 23D. However, the projection portion preferably has a shape projecting from a short side to obtain some of the above-described operational effects.

The dispositions and the shapes of the projection portions of the frames 23A, 23B, 23C, and 23D indicated in the derived examples and the disposition and the shape of the projection portion of the frame 23 can be combined with each other as appropriate, and the operational effects in accordance with the combinations can be produced.

In the above description, the outer shapes of the vibrating member 21 and the frame 23 are octagonal in plan view. However, the outer shapes of the vibrating member and the frame in plan view may be other polygons. The polygons in this case are, in plan view, not limited to shapes having corner portions where straight lines intersect but may be shapes including a curve (a rounded shape such as a shape rounded by chamfering). Furthermore, the outer shapes of the vibrating member and the frame are not necessarily completely similar to each other.

10 pump
11 actuator
20 housing
21 vibrating member
22 lid member
23, 23A, 23B, 23C, 23D frame
30 piezoelectric element
41, 42 electrode pattern
211 main flat plate
F211, F212 main surface
212 outer edge portion
213 connecting portion
214 opening

220 opening
230 inner space
231, 232 main surface
239 projection portion
241, 242 adhesive
411, 421 inner connecting portion
412, 422 outer terminal
2331, 2332, 2333, 2334, 2341, 2342, 2343, 2344 side surface
2391A, 2391B, 2391C, 2391D, 2392B, 2393B, 2394A, 2394B projection portion

The invention claimed is:

1. An actuator comprising:
a plate-shaped vibrating member including a first main surface and a second main surface, and an outer edge portion, wherein a piezoelectric element is mounted on at least one of the first main surface and the second main surface, and the outer edge portion has a greater shape than the piezoelectric element in plan view and does not abut the piezoelectric element;
a frame superposed on a portion of the vibrating member; and
an adhesive configured to adhere the frame and the first main surface or the second main surface in the outer edge portion of the vibrating member to each other; wherein,
the frame includes a projection portion projecting outward from a part of an outer edge of the frame, and
the frame defines an opening.

2. The actuator according to claim 1, wherein
the outer edge of the frame is an octagon in plan view, and
the projection portion is provided in a side surface being different from a side surface forming a longest side in the octagon.

3. The actuator according to claim 1,
further comprising a plurality of projection portions including the projection portion, wherein
the plurality of projection portions at least include a first projection portion having a first shape and a second projection portion having a second shape that is different from the first shape, and
the first projection portion is disposed at a specific position at the outer edge.

4. The actuator according to claim 1, wherein
the frame includes only one projection portion.

5. The actuator according to claim 1, wherein
the projection portion is disposed in a space surrounded by phantom lines extending from a first connection side surface and a second connection side surface connected to both ends of a side surface where the projection portion is provided.

6. The actuator according to claim 1, further comprising:
an electrode pattern connected to the piezoelectric element, wherein
the electrode pattern includes an inner connecting portion superposed on the piezoelectric element or the outer edge portion in plan view and an outer terminal connected to an outside, and wherein
the outer terminal has a shape projecting further outward than an outer edge of the vibrating member in the plan view, and,
in plan view, the projection portion and a portion where the outer terminal projects outward are disposed at positions spaced from each other with the frame interposed therebetween.

7. A pump comprising:
the actuator according to claim 1; and
a lid member having a plate shape and facing the vibrating member with the frame interposed therebetween.

8. A method for manufacturing the actuator according to claim 1, comprising
cutting a plurality of frames according to claim 1 out of a mother board comprising a metal extended in a predetermined direction such that positions of the respective projection portion of each of the respective frames are the same.

9. The actuator according to claim 2, further comprising
a plurality of projection portions including the projection portion, wherein
the plurality of projection portions at least include a first projection portion having a first shape and a second projection portion having a second shape that is different from the first shape, and
the first projection portion is disposed at a specific position at the outer edge.

10. The actuator according to claim 2, wherein
the frame includes only one projection portion.

11. The actuator according to claim 2, wherein
the projection portion is disposed in a space surrounded by phantom lines extending from a first connection side surface and a second connection side surface connected to both ends of a side surface where the projection portion is provided.

12. The actuator according to claim 3, wherein
the projection portion is disposed in a space surrounded by phantom lines extending from a first connection side surface and a second connection side surface connected to both ends of a side surface where the projection portion is provided to the side surface where the projection portion is provided and the side surface where the projection portion is provided.

13. The actuator according to claim 4, wherein
the projection portion is disposed in a space surrounded by phantom lines extending from a first connection side surface and a second connection side surface connected to both ends of a side surface where the projection portion is provided.

14. The actuator according to claim 2, further comprising:
an electrode pattern connected to the piezoelectric element, wherein
the electrode pattern includes an inner connecting portion superposed on the piezoelectric element or the outer edge portion in plan view and an outer terminal connected to an outside, and wherein
the outer terminal has a shape projecting further outward than an outer edge of the vibrating member in the plan view, and,
in plan view, the projection portion and a portion where the outer terminal projects outward are disposed at positions spaced from each other with the frame interposed therebetween.

15. The actuator according to claim 3, further comprising:
an electrode pattern connected to the piezoelectric element, wherein
the electrode pattern includes an inner connecting portion superposed on the piezoelectric element or the outer edge portion in plan view and an outer terminal connected to an outside, and wherein
the outer terminal has a shape projecting further outward than an outer edge of the vibrating member in the plan view, and,
in plan view, the projection portion and a portion where the outer terminal projects outward are disposed at positions spaced from each other with the frame interposed therebetween.

16. The actuator according to claim 4, further comprising:
an electrode pattern connected to the piezoelectric element, wherein
the electrode pattern includes an inner connecting portion superposed on the piezoelectric element or the outer edge portion in plan view and an outer terminal connected to an outside, and wherein
the outer terminal has a shape projecting further outward than an outer edge of the vibrating member in the plan view, and,
in plan view, the projection portion and a portion where the outer terminal projects outward are disposed at positions spaced from each other with the frame interposed therebetween.

17. The actuator according to claim 5, further comprising:
an electrode pattern connected to the piezoelectric element, wherein
the electrode pattern includes an inner connecting portion superposed on the piezoelectric element or the outer edge portion in plan view and an outer terminal connected to an outside, and wherein
the outer terminal has a shape projecting further outward than an outer edge of the vibrating member in the plan view, and,
in plan view, the projection portion and a portion where the outer terminal projects outward are disposed at positions spaced from each other with the frame interposed therebetween.

18. A pump comprising:
the actuator according to claim 2; and
a lid member having a plate shape and facing the vibrating member with the frame interposed therebetween.

19. A pump comprising:
the actuator according to claim 3; and
a lid member having a plate shape and facing the vibrating member with the frame interposed therebetween.

20. A pump comprising:
the actuator according to claim 4; and
a lid member having a plate shape and facing the vibrating member with the frame interposed therebetween.

* * * * *